United States Patent
Arvelo et al.

(10) Patent No.: US 9,647,762 B2
(45) Date of Patent: May 9, 2017

(54) INTEGRATED PARALLEL OPTICAL TRANSCEIVER

(71) Applicant: International Business Machines Corporation, Armonk, NY (US)

(72) Inventors: Amilcar Arvelo, Poughkeepsie, NY (US); Alan F. Benner, Poughkeepsie, NY (US); Michael J. Ellsworth, Poughkeepsie, NY (US); Eric J. McKeever, Poughkeepsie, NY (US); Thong N. Nguyen, Poughkeepsie, NY (US); Edward J. Seminaro, Milton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/844,661

(22) Filed: Sep. 3, 2015

(65) Prior Publication Data

US 2016/0226592 A1   Aug. 4, 2016

Related U.S. Application Data

(63) Continuation of application No. 14/614,052, filed on Feb. 4, 2015.

(51) Int. Cl.
*H04B 10/00* (2013.01)
*H04B 10/40* (2013.01)
(Continued)

(52) U.S. Cl.
CPC ............. *H04B 10/40* (2013.01); *G02B 6/425* (2013.01); *G02B 6/4246* (2013.01);
(Continued)

(58) Field of Classification Search
CPC ....... H04B 10/40; H04B 10/503; H01S 5/423; H01S 5/02476; H01S 5/0228;
(Continued)

(56) References Cited

U.S. PATENT DOCUMENTS

| 5,359,447 A | 10/1994 | Hahn et al. |
| 5,596,595 A | 1/1997 | Tan et al. |

(Continued)

FOREIGN PATENT DOCUMENTS

| CN | 203133336 U | 8/2014 |
| DE | 4444470 A1 | 5/1996 |

(Continued)

OTHER PUBLICATIONS

U.S. Appl. No. 14/614,052, filed Feb. 4, 2015—This reference is not provided because it is readily available to the Examiner.
(Continued)

*Primary Examiner* — M. R. Sedighian
(74) *Attorney, Agent, or Firm* — Maeve Carpenter

(57) ABSTRACT

Aspects of the present invention include an optical transceiver for providing transmission and reception of optical signals. The optical transceiver includes a carrier having two opposing surfaces and one or more openings extending from a first of the two opposing surfaces to a second of the two opposing surfaces. The optical transceiver includes a laser driver chip coupled to the first surface. The optical transceiver includes a vertical cavity surface emitting laser (VCSEL) array chip coupled to the first surface. The optical transceiver includes a photodetector array chip coupled to the first surface. The optical transceiver includes a receiver amplifier chip coupled to the first surface. The optical transceiver includes an optical coupling element coupled to the second surface. The VCSEL array chip and the photo-
(Continued)

detector array chip are disposed such that optical signals can pass through the one or more openings in the carrier.

15 Claims, 9 Drawing Sheets

(51) Int. Cl.
| | | |
|---|---|---|
| *G02B 6/42* | (2006.01) | |
| *H01S 5/022* | (2006.01) | |
| *H01S 5/024* | (2006.01) | |
| *H01S 5/026* | (2006.01) | |
| *H01S 5/42* | (2006.01) | |
| *H04B 10/50* | (2013.01) | |
| *G02B 6/43* | (2006.01) | |

(52) U.S. Cl.
CPC ......... *G02B 6/4272* (2013.01); *G02B 6/4286* (2013.01); *G02B 6/4292* (2013.01); *G02B 6/4295* (2013.01); *G02B 6/4296* (2013.01); *H01S 5/0228* (2013.01); *H01S 5/0261* (2013.01); *H01S 5/02476* (2013.01); *H01S 5/423* (2013.01); *H04B 10/503* (2013.01); *G02B 6/428* (2013.01); *G02B 6/43* (2013.01)

(58) Field of Classification Search
CPC ....... H01S 5/0261; G02B 6/4295; G02B 6/43; G02B 6/4246; G02B 6/425; G02B 6/4272; G02B 6/4286; G02B 6/4292; G02B 6/4296; G02B 6/428
USPC .................................................. 398/135, 138
See application file for complete search history.

(56) References Cited

U.S. PATENT DOCUMENTS

| | | | |
|---|---|---|---|
| 5,761,229 | A | 6/1998 | Baldwin et al. |
| 6,366,380 | B1 | 4/2002 | Chesavage |
| 6,947,456 | B2 | 9/2005 | Chin et al. |
| 7,447,440 | B2 | 11/2008 | Theodoras, II |
| 7,455,463 | B2 | 11/2008 | Togami et al. |
| 7,539,366 | B1 | 5/2009 | Baks et al. |
| 8,047,856 | B2 | 11/2011 | McColloch |
| 8,188,381 | B2 | 5/2012 | Chan |
| 8,351,794 | B2 | 1/2013 | Meadowcroft et al. |
| 8,396,370 | B2 | 3/2013 | Mu |
| 8,414,309 | B2 | 4/2013 | Meadowcroft et al. |
| 8,511,913 | B2 | 8/2013 | Ishii |
| 8,529,140 | B2 | 9/2013 | McColloch |
| 8,536,610 | B2 | 9/2013 | Doany et al. |
| 8,550,728 | B2 | 10/2013 | Takahashi et al. |
| 8,559,824 | B2 | 10/2013 | McColloch et al. |
| 2009/0028575 | A1 | 1/2009 | Epitaux et al. |
| 2009/0226130 | A1 | 9/2009 | Doany et al. |
| 2011/0044367 | A1* | 2/2011 | Budd .................. G02B 6/4201 372/50.21 |
| 2012/0063718 | A1 | 3/2012 | Steijer et al. |
| 2012/0163811 | A1* | 6/2012 | Doany .................. H04B 10/40 398/41 |
| 2013/0156386 | A1 | 6/2013 | Miller |
| 2013/0287404 | A1 | 10/2013 | McColloch et al. |
| 2014/0044388 | A1 | 2/2014 | Su et al. |
| 2015/0037044 | A1* | 2/2015 | Peterson .............. G02B 6/4292 398/135 |

FOREIGN PATENT DOCUMENTS

| | | |
|---|---|---|
| EP | 0975072 A2 | 1/2000 |
| EP | 2533380 A1 | 12/2012 |
| WO | 03001246 A2 | 1/2003 |

OTHER PUBLICATIONS

List of IBM Patents or Patent Applications Treated as Related (Appendix P), filed herewith.
"Active Optical Modules Overview", © 2014 TE Connectivity Ltd., provided by inventors in Main idea, <http://www.te.com/catalog/minf/en/800?BML=10576,24226,24835>.
"Avago Technologies beats Emcore in court", Lightwave, Sep./Oct. Magazine Issue, Nov. 17, 2011, <http://www.lightwaveonline.com/articles/2011/11/avago-technologies-beats-emcore-in-court-134041878.html>.
Davis, "Emcore Infringed Avago Optics Patent, ITC Affirms", Law 360, May 14, 2010, <http://www.law360.com/articles/168597/emcore-infringed-avago-optics-patent-itc-affirms>.
"Finisar Demonstrates Board Mount Parallel Optics for Optical Backplanes at OFC/NFOEC 2012", Mar. 6, 2012, Source: Finisar, News Provided by Acquire Media, Copyright 2014 Finisar Corporation, <http://investor.finisar.com/releaseDetail.cfm?ReleaseID=654904>.
Hardy, "ITC issues split decision on Avago Patent fight with Mellanox", Lightwave, Sep./Oct. Magazine Issue, Jan. 16, 2014, <http://www.lightwaveonline.com/articles/2014/01/itc-issues-split-decision-on-avago-patent-fight-with-mellanox.html>.
Hegde et al, "Thermal-Mechanical Analysis of Terabus High-Speed Optoelectronic Package", IBM T.J. Watson Research Center, Yorktown Heights, NY, 2005 Electronic Components and Technology Conference, pp. 1854-1858, © 2005 IEEE.
"MicroPOD™ and MiniPOD™ 120G Transmitters/Receivers", Avago Technologies, Copyright 2005-2015 Avago Technologies, downloaded on Jan. 22, 2015, <http://www.avagotech.com/pages/minipod_micropod>.
Mohammed et al, "Optical I/O technology for digital VLSI", Photonics Packaging and Integration IV, Proceedings of SPIE, vol. 5358, doi: 10.1117/12.530160, pp. 60-70, SPIE, Bellingham, WA, 2004.

\* cited by examiner

INTEGRATED PARALLEL OPTICAL TRANSCEIVER

STATEMENT REGARDING FEDERALLY SPONSORED WORK

This invention was made with United States Government support under contract number H98230-13-D-0122 entered with the following United States Governmental Agency: Department of Defense. The United States government has certain rights to this invention.

BACKGROUND OF THE INVENTION

The present invention relates generally to the field of optical transceiver devices, and more particularly to an integrated parallel optical transceiver with high bandwidth density and thermal performance.

An optical transceiver is a device that combines an optical transmitter and an optical receiver, and uses optical transmission technology to communicate between other electronic devices, versus a chip that transfers information electrically through metal wires. Typically, optical signals are passed through optical fibers between source optical transmitter and destination optical receiver. The use of fiber optic transmission technology is rapidly growing since optical signals can carry information at a higher data rate, over longer distances, than methods of transferring data using electrical conduction.

The highest performance optical transceivers send and receive information through laser diodes and photodiodes. Laser diodes convert information from an electrical format to an optical format, and photodiodes convert optical information back to an electrical format. Not only does light carry information farther and faster than its electrical counterpart, optical transceivers, cables, and connectors are becoming physically smaller, and can, in some circumstances, be physically smaller than the electrical counterparts.

SUMMARY

Aspects of the present invention include an optical transceiver for providing transmission and reception of optical signals. The optical transceiver includes a carrier having two opposing surfaces and one or more openings extending from a first of the two opposing surfaces to a second of the two opposing surfaces. The optical transceiver includes a laser driver chip coupled to the first surface. The optical transceiver includes a vertical cavity surface emitting laser (VCSEL) array chip coupled to the first surface. The optical transceiver includes a photodetector array chip coupled to the first surface. The optical transceiver includes a receiver amplifier chip coupled to the first surface. The optical transceiver includes an optical coupling element coupled to the second surface. The VCSEL array chip and the photodetector array chip are disposed such that optical signals can pass through the one or more openings in the carrier.

DETAILED DESCRIPTION

Figure 1A:
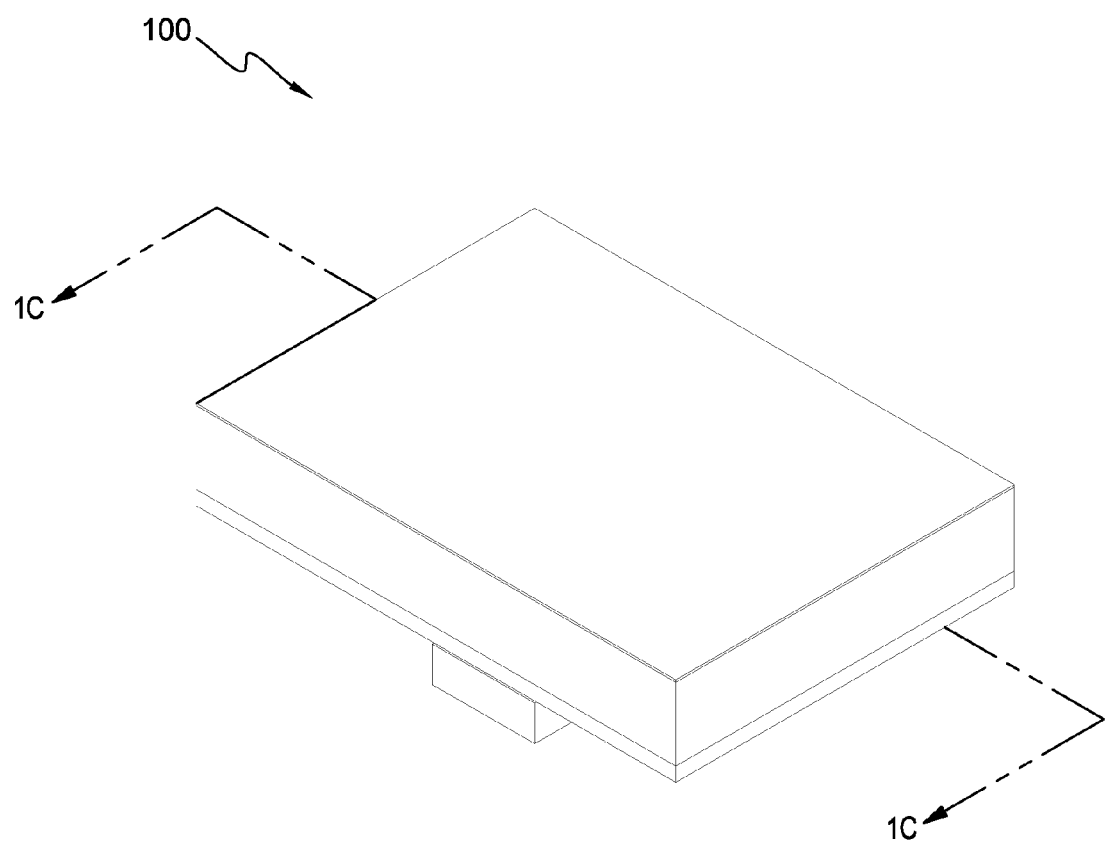
FIG. 1A depicts a top isometric view of an integrated parallel optical transceiver, in accordance with an embodiment of the present invention.

In optical data transmission, the physical design of optical transceivers (transmitters/receivers) has generally been challenging. An optical transmitter, receiver, or transceiver has three fundamental sets of interfaces: electrical I/Os for power and for data to be transmitted or received, optical I/Os for the transmitted or received data, and thermal interfaces for removing heat generated in the transceiver. Since a transceiver installed in a computer system generally has a planar structure, with two large surfaces and four much smaller surfaces around the edges, optimizing a layout of electrical, optical, and thermal I/Os across the two large interfaces has proved challenging. Transceiver design has also been complicated by the difficulty of building optical fibers that can bend tightly, with a small radius. In addition, as electronic equipment has become more powerful over time, the requirements for transceiver bandwidth have increased, further exacerbating the challenges for transceiver design.

The challenging requirements, along with additional requirements for density, simple construction, mechanical robustness, cleanliness, resistance to corrosion, and cost, in a variety of electronic equipment designs, have resulted in a wide variety of proposed transceiver packaging options. However, existing optical transceiver designs may not meet the needs of electronic equipment designs that can support high performance information processing and transmission.

Embodiments of the present invention recognize that transceiver performance can be improved by providing a design for a parallel optical transceiver that provides high aggregate bandwidth at a high density with improved cooling and reliability. Implementation of embodiments of the invention may take a variety of forms, and exemplary implementation details are discussed subsequently with reference to the Figures.

Embodiments of the present invention will now be described in detail with reference to the accompanying drawings. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, and elements and features can have different dimensions than those depicted in the figures. Therefore, specific structural and functional details disclosed herein are not to be interpreted as limiting, but merely as a representative basis for teaching one skilled in the art to variously employ the present invention.

References in the specification to "an exemplary embodiment," "other embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIGS. 1A through 1E provide only an illustration of one implementation and do not imply any limitations with regard to different embodiments which may be implemented. Many modifications to the depicted embodiment may be made by those skilled in the art without departing from the scope of the invention as recited by the claims.

FIG. 1A depicts a top isometric view of integrated parallel optical transceiver 100, in accordance with an embodiment of the present invention. Integrated parallel optical transceiver 100 is an optical transmitter/receiver module for vertical cavity surface emitting lasers (VCSEL) and multi-mode or single-mode optical fibers. Integrated parallel optical transceiver 100 is an electrical and optical component capable of transmitting and receiving pulses of light which communicate data. In another embodiment, integrated parallel optical transceiver 100 may contain only optical transmitter circuitry (i.e., lasers and laser driver circuitry). In a further embodiment, integrated parallel optical transceiver 100 may contain only optical receiver circuitry (i.e., photodetectors and receiver amplifier circuitry). In yet another embodiment, integrated parallel optical transceiver 100 may include a full unidirectional link with the aforementioned transmitter device connected through optical fibers to the aforementioned receiver device.

Figure 1B:
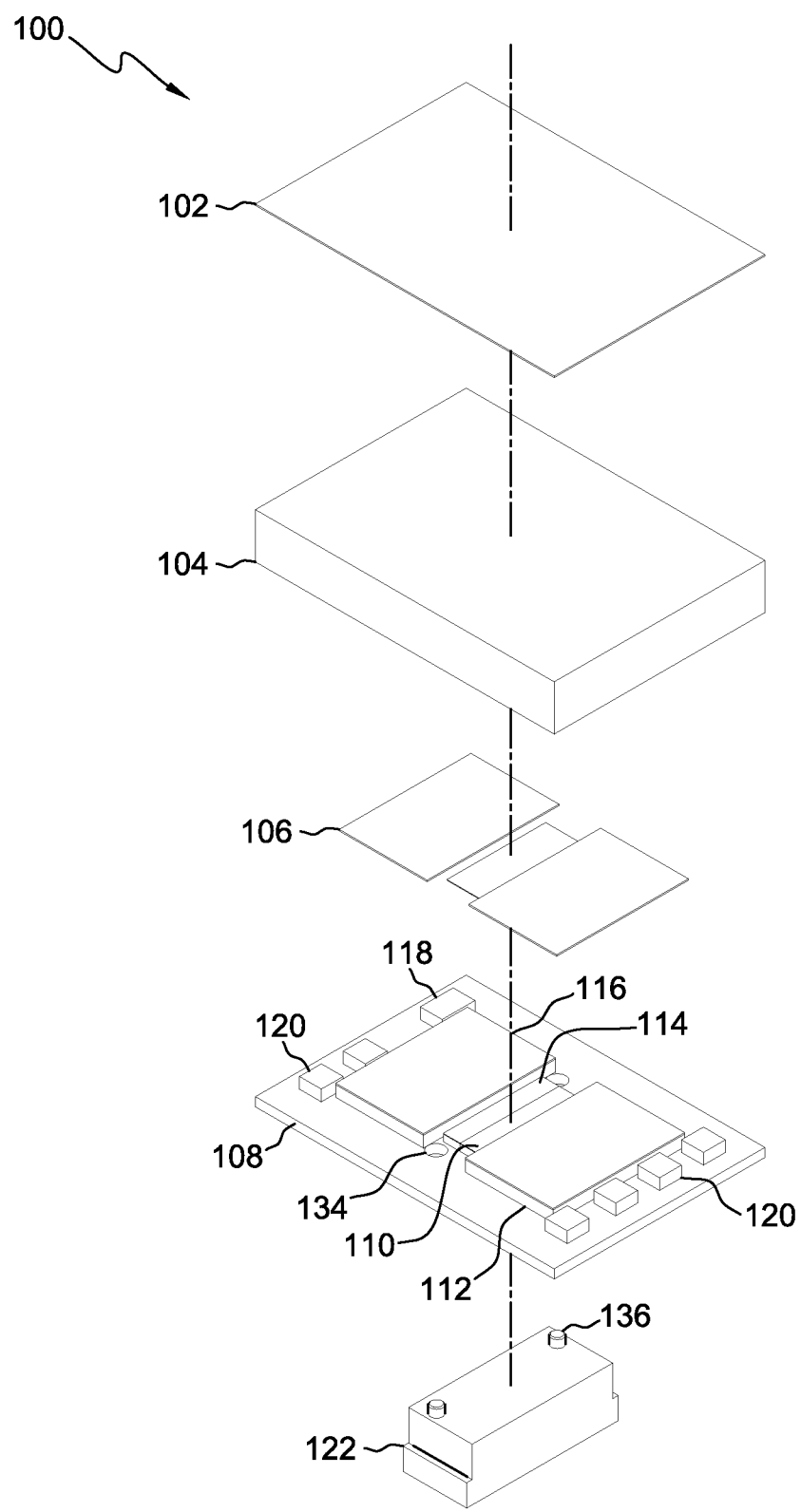
FIG. 1B depicts an exploded view of the integrated parallel optical transceiver of FIG. 1A, in accordance with an embodiment of the present invention.

FIG. 1B depicts an exploded view of integrated parallel optical transceiver 100 of FIG. 1A, in accordance with an embodiment of the present invention. Integrated parallel optical transceiver 100 includes external thermal interface material 102, heat spreader/stiffener 104, internal thermal interface material 106, carrier 108, VCSEL array chip 110, laser driver chip 112, photodetector array chip 114, receiver amplifier chip 116, microcontroller 118, power decoupling components 120, and optical coupling element 122. VCSEL array chip 110, laser driver chip 112, photodetector array chip 114, receiver amplifier chip 116, microcontroller 118, and power decoupling components 120 are collectively referred to as active components of integrated parallel optical transceiver 100. For illustrative purposes, additional active components that may be present on integrated parallel optical transceiver 100 are not shown. Integrated parallel optical transceiver 100 is designed and built such that at least a majority of active components are coupled to one side of carrier 108 for optimizing thermal management, i.e., removing heat generated by the device.

In one embodiment, external thermal interface material 102 enhances thermal management of integrated parallel optical transceiver 100 by removing heat generated by one or more of the active components. External thermal interface material 102 comprises any suitable thermal interface materials known in the art. For example, external thermal interface material 102 may be a thermal pad or "gap pad", such as an indium pad with an aluminum coating. In another example, external thermal interface material 102 may be a gap filler paste, such as a pre-cured, dispensable, conformable compound. In one embodiment, external thermal interface material 102 is coupled to heat spreader/stiffener 104. For example, external thermal interface material 102 may adhere to heat spreader/stiffener 104 via one of a plurality of adhesives known in the art. In another embodiment, external thermal interface material 102 may be coupled with a finned heatsink.

Heat spreader/stiffener 104 distributes heat from the active components in the device and provides mechanical stiffness to the overall structure. Heat spreader/stiffener 104 may prevent warpage during heating and cooling excursions. Heat spreader/stiffener 104 may also add mechanical strength to the overall device to support land grid array (LGA) loads and handling loads. Heat spreader/stiffener 104 is constructed of one of a plurality of heat conducting materials. For example, heat spreader/stiffener 104 may be constructed of a base material such as copper or aluminum. In addition, the base material may be plated with another material, such as nickel. Heat spreader/stiffener 104 may be fabricated by stamping or machining the base material. Heat spreader/stiffener 104 may contain features such as grooves or slots to reduce lateral heat transfer, keeping heat from laser driver chip 112 and receiver amplifier chip 116 away from VCSEL array chip 110 and photodetector array chip 114, which may be generally temperature sensitive. Heat spreader/stiffener 104 may be coupled to one or both of external thermal interface material 102 and internal thermal interface material 106. For example, heat spreader/stiffener 104 may adhere to external thermal interface material 102 via one of a plurality of adhesives known in the art. In another example, heat spreader/stiffener 104 may adhere to internal thermal interface material 106 via one of a plurality of adhesives known in the art.

Internal thermal interface material 106 is an intermediary component that increases thermal conductivity between one or more heat producing components within integrated parallel optical transceiver 100 and heat spreader/stiffener 104. Internal thermal interface material 106 is any one of a plurality of thermal interface materials known in the art. For example, internal thermal interface material 106 may be a thermal paste or thermal grease made up of a non-curing polymeric matrix to which conductive filler particles are added to make the compound thermally conductive. In another example, internal thermal interface material 106 may be a thermal gel, which is cured to provide lateral stability. In a further example, internal thermal interface material 106 may be a thermal pad material. In one embodiment, internal thermal interface material 106 may be dispensed on one side of heat spreader/stiffener 104 in a pattern such that, upon assembly, internal thermal interface material 106 is in contact with one or more heat producing, active components within integrated parallel optical transceiver 100 and also in contact with heat spreader/stiffener 104. In another embodiment, internal thermal interface material 106 may be dispensed on top of one or more heat producing, active components within integrated parallel optical transceiver 100.

Figure 1C:
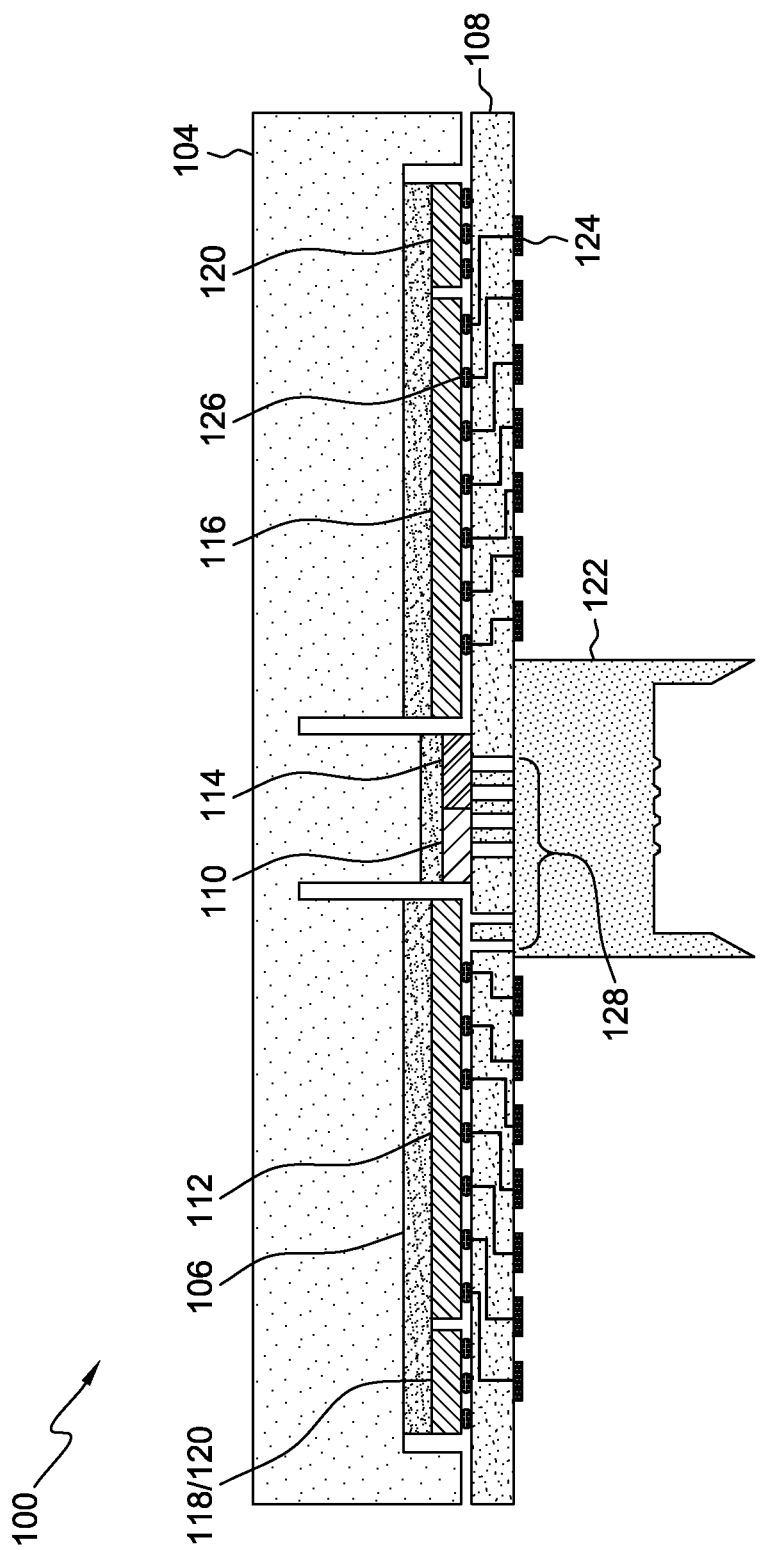
FIG. 1C depicts a cross sectional view of the integrated parallel optical transceiver, taken along line 1C-1C of FIG. 1A, in accordance with an embodiment of the present invention.

Carrier 108 mechanically supports and electronically couples electronic components, such as laser driver chip 112, VCSEL array chip 110, photodetector array chip 114, and receiver amplifier chip 116, to other electronic components within integrated parallel optical transceiver 100. Carrier 108 includes signal traces, or electrical wires, through which electrical signals pass from at least one component to at least one additional component coupled with carrier 108 or from at least one component to a PCB to which carrier 108 is electrically coupled. In one embodiment, carrier 108 also mounts to a host printed circuit board (PCB) to carry electrical power, low-speed management signals, and high-speed data signals. Carrier 108 may be, for example, an organic laminate, which is similar to conventional chip carriers. In one embodiment, carrier 108 is a multi-layer organic laminate. In another embodiment, carrier 108 may be a ceramic carrier. Carrier 108 incorporates an array of electrical contact pads (not shown) on at least one surface, for the electronic coupling of the components. Carrier 108 may be electronically coupled to the components via flip chip assembly. Flip chip interconnection assembly of components to carrier 108 provides electrical contacts for enabling signal communication between the components and carrier 108. Flip chip offers increased high speed electrical performance. Flip chip is one type of mounting used for semiconductor devices which does not require any wire bonds. Eliminating wire bond wires can reduce the delaying inductance and capacitance of a connection by a factor of ten and may shorten an electrical path by a factor of 25 to 100. The result is a higher speed interconnection. Carrier 108 also incorporates an array of electrical contact pads 124 on the bottom surface, as shown in FIG. 1C, for conventional LGA or ball grid array (BGA) mounting to a PCB. The array provides electrical contact pads 124 in an arrangement sufficient for connection with a PCB. An example of a layout of electrical contact pads 124 is depicted and described in further detail with respect to FIG. 5. The electrical contact pads are typically gold-plated copper pads with a nickel diffusion barrier layer between the copper and the gold. Carrier 108 also includes openings 134 that extend from one surface of carrier 108 to an opposing surface of carrier 108. Openings 134 enable mechanical coupling of optical coupling element 122 to carrier 108.

VCSEL array chip 110 is a transmitter that outputs light with an output modulated in response to transmitted data patterns. Laser driver chip 112 interfaces between an external data chip (not shown) and lasers in VCSEL array chip 110, modulating output of light pulses from VCSEL array chip 110 to represent ones and zeros for communicating data. Laser driver chip 112 includes a monitor feedback photodiode (not shown) to electronically monitor the light output from the lasers in VCSEL array chip 110.

Photodetector array chip 114 receives light pulses as input, and converts optical intensity pulses to pulses of electrical current. Receiver amplifier chip 116 converts electrical current pulses received by photodetector array chip 114 into electrical voltage signals that external electronic circuitry can easily detect.

Microcontroller 118 enables management and monitoring of integrated parallel optical transceiver 100 by external electronic devices. Such management and monitoring may include control of bias current of lasers from laser driver chip 112 to VCSEL array chip 110, or configuration and tuning of amplification or equalization settings in receiver amplifier chip 116. Such management and monitoring may also include monitoring of temperature, voltage, or current, using sensors (not shown) incorporated into various active components of integrated parallel optical transceiver 100.

Power decoupling components 120 provide smoothing or conversion of electrical power provided to laser driver chip 112, receiver amplifier chip 116, and other active components of integrated parallel optical transceiver 100. Power decoupling components 120 may be, for example, one or more capacitors or inductors. Power decoupling components 120 may also be, for example, one or more DC/DC converters.

In one embodiment, VCSEL array chip 110, laser driver chip 112, photodetector array chip 114, receiver amplifier chip 116, microcontroller 118, and power decoupling components 120 all electronically couple with carrier 108 via flip chip connections. The flip chip connections are made via the presence of conductive bumps 126 on one surface of the components, as shown in FIG. 1C. Conductive bumps may be, for example, solder bumps, gold balls, molded studs, or electrically conductive plastics. Conductive bumps 126 electronically couple with the electrical contact pads on at least one surface of carrier 108. In some embodiments, conductive bumps 126 metallurgically couple with the electrical contact pads on at least one surface of carrier 108. This type of mounting leaves a small space between the components' circuitry and the underlying carrier.

Optical coupling element 122 provides optical feedback for the transmitter portion of integrated parallel optical transceiver 100, allowing monitoring of transmitted optical power. Optical coupling element 122 is coupled with an opposing side of carrier 108 from VCSEL array chip 110 and photodetector array chip 114 in precise optical alignment. In one embodiment, optical coupling element 122 is coupled to carrier 108 via posts 136. In one embodiment, posts 136 are molded into the body of optical coupling element 122. In another embodiment, posts 136 may be inserted into openings in optical coupling element 122. Posts 136 provide alignment of optical coupling element 122 in carrier 108 when inserted into openings 134 in carrier 108. In a further embodiment, optical coupling element 122 may be coupled with carrier 108 with a clear epoxy. Optical coupling element 122 is depicted and described in further detail with respect to FIG. 4.

FIG. 1C depicts a cross sectional view of integrated parallel optical transceiver 100, taken along line 1C-1C of FIG. 1A, in accordance with an embodiment of the present invention. In this view, integrated parallel optical transceiver 100 includes heat spreader/stiffener 104, internal thermal interface material 106, carrier 108, VCSEL array chip 110, photodetector array chip 114, laser driver chip 112, receiver amplifier chip 116, microcontroller 118, and power decoupling components 120. External thermal interface material 102 is not shown. Carrier 108 includes openings 128. Carrier 108 utilizes openings 128 to accommodate the interaction of optical signals between laser driver chip 112, VCSEL array chip 110, and photodetector array chip 114, through carrier 108, with optical coupling element 122 on the opposing side of carrier 108. Openings 128 include one or more areas that are devoid of structure, and extend from one surface of carrier 108 to an opposing surface of carrier 108. Typically, openings 128 are cylindrical areas surrounded by carrier 108. However, it should be noted that openings 128 may be any regular or irregular geometric shape and may not be entirely surrounded by carrier 108. For example, openings 128 may only be partially surrounded by carrier 108, depending on whether openings 128 are on an edge or corner of carrier 108. In one embodiment, openings 128 include 32 transmitter openings aligned with laser driver chip 112, 32 transmitter openings aligned with VCSEL array chip 110, and 32 receiver openings aligned with photodetector array chip 114. The cross section view of integrated parallel optical transceiver 100 also includes conductive bumps 126 which are representative of conductive bumps on one surface of at least a majority of the active components. In an embodiment, an electrically-insulating adhesive may be "under filled" in the space between carrier 108 and conductive bumps 126 to provide a stronger connection between conductive bumps 126 and carrier 108. The adhesive can also provide a heat bridge as well as reduce stress on conductive bumps 126 due to differential expansion or compression under heating of carrier 108 and the active components, thereby improving reliability of integrated parallel optical transceiver 100.

Heat spreader/stiffener 104 is depicted in contact with VCSEL array chip 110, laser driver chip 112, photodetector array chip 114, and receiver amplifier chip 116, as well as microcontroller 118 and power decoupling components 120, via internal thermal interface material 106, as enabled by a planar structure of the component layout on carrier 108. Electrical contact pads 124 are shown on the bottom surface of carrier 108. As discussed earlier, electrical contact pads 124 enable electronic coupling of carrier 108 to a host PCB via LGA or BGA technology. Optical coupling element 122 is coupled to carrier 108, in precise alignment with VCSEL array chip 110 and photodetector array chip 114, and incorporates both focusing and alignment elements, to interface between integrated parallel optical transceiver 100 and an external optical fiber connector (not shown), and reflective elements, to provide feedback to monitor a photodiode array on laser driver chip 112. For clarity, posts 136 are not shown in this view.

Figure 1D:
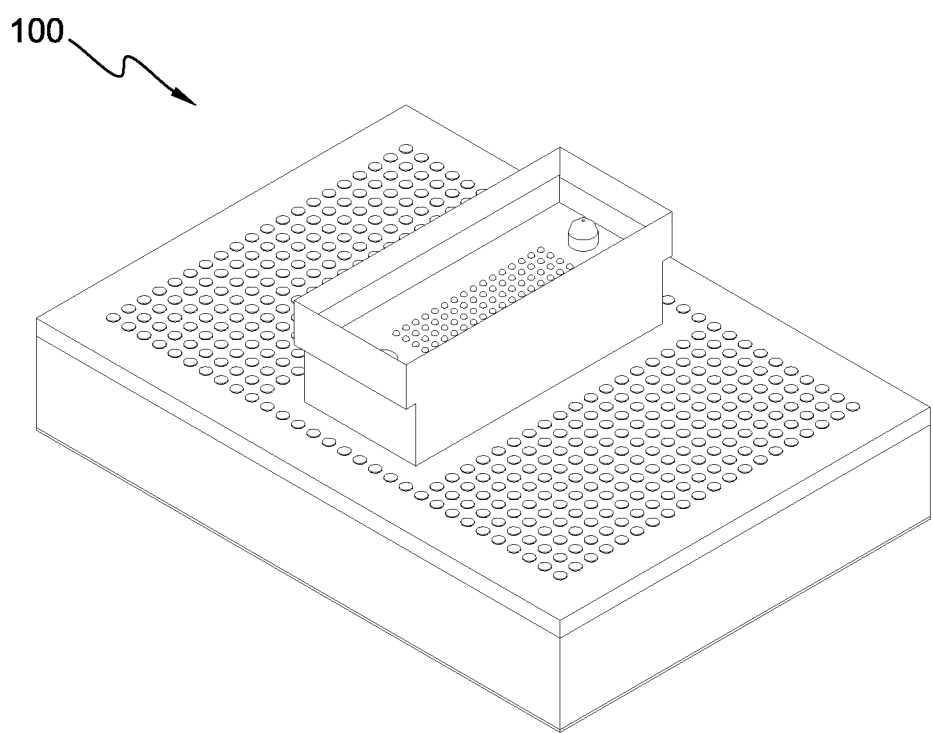
FIG. 1D depicts a bottom isometric view of the integrated parallel optical transceiver, in accordance with an embodiment of the present invention.

FIG. 1D depicts a bottom isometric view of integrated parallel optical transceiver 100, in accordance with an embodiment of the present invention.

Figure 1E:
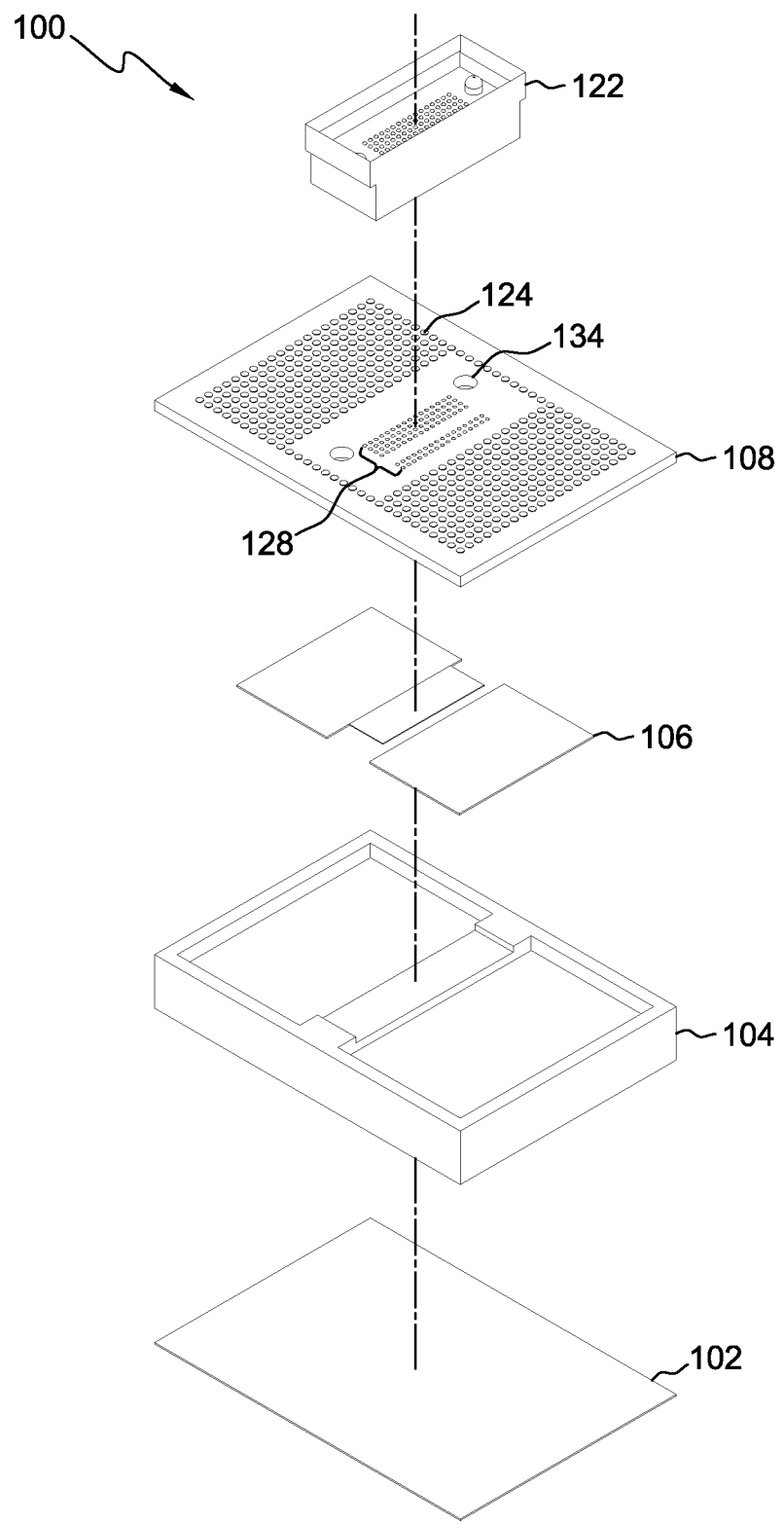
FIG. 1E depicts an exploded view of the integrated parallel optical transceiver of FIG. 1D, in accordance with an embodiment of the present invention.

FIG. 1E depicts an exploded view of integrated parallel optical transceiver 100 of FIG. 1D, in accordance with an embodiment of the present invention. Carrier 108 includes electrical contact pads 124. Visible in this view are electrical contact pads 124, openings 128, and openings 134. Electrical contact pads 124 are arranged in an array such that electronic coupling occurs between the components on the top surface of carrier 108 and a host PCB (not shown) to which carrier 108 is connected on the bottom surface. The electrical connections made by electrical contact pads 124 are depicted and described in further detail with respect to FIG. 5.

Figure 2:
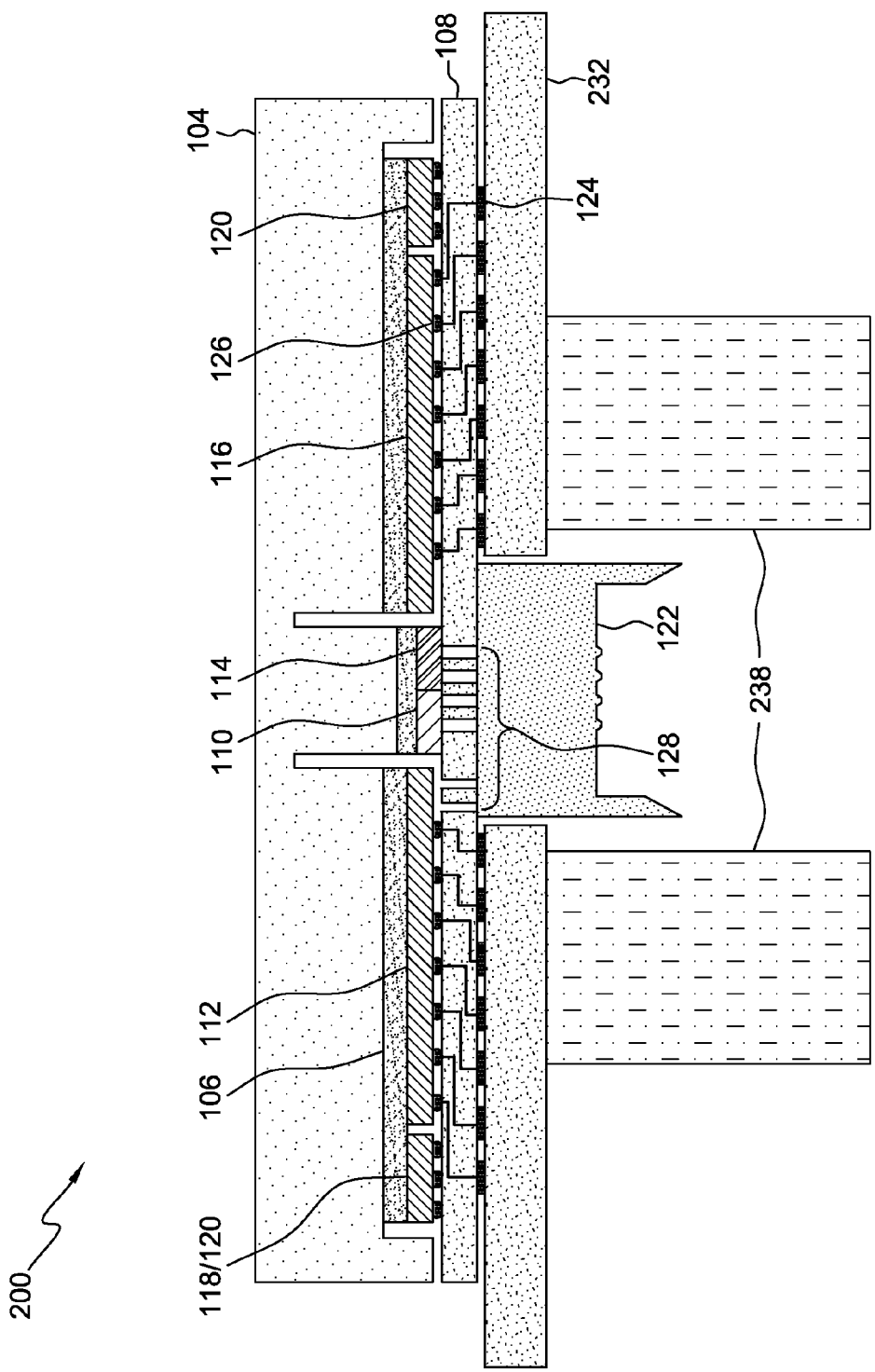
FIG. 2 is a cross sectional view of the integrated parallel optical transceiver coupled with a printed circuit board, in accordance with an alternate embodiment of the present invention.

FIG. 2 is a cross sectional view of integrated parallel optical transceiver 100 coupled with a printed circuit board, in accordance with an alternate embodiment of the present invention. In the embodiment depicted in FIG. 2, integrated parallel optical transceiver 100 is electronically coupled to PCB 232 via electrical contact pads 124. In one embodiment, the electronic coupling between carrier 108 and PCB 232 is made via LGA technology. Electrical contact pads on PCB 232 and a clamping mechanism required for LGA technology are not shown. In another embodiment, the electronic coupling between carrier 108 and PCB 232 may be made via BGA technology. Alignment housing 238 enables alignment for mating of optical coupling element 122 with an optical connector (not shown) such that optical coupling element 122 interfaces with a plurality of optical fibers. Coupling of integrated parallel optical transceiver 100 to PCB 232 creates a "pluggable" module such as the technology used between a daughter board and mother board, as is known in the art. Alignment housing 238 is coupled to the bottom surface of PCB 232. For example, coupling of alignment housing 238 to PCB 232 may be accomplished using one of a plurality of adhesives known in the art. In another example, alignment housing 238 may be mechanically coupled to PCB 232. In one embodiment, alignment housing 238 surrounds the mated optical connector (not shown).

Figure 3:
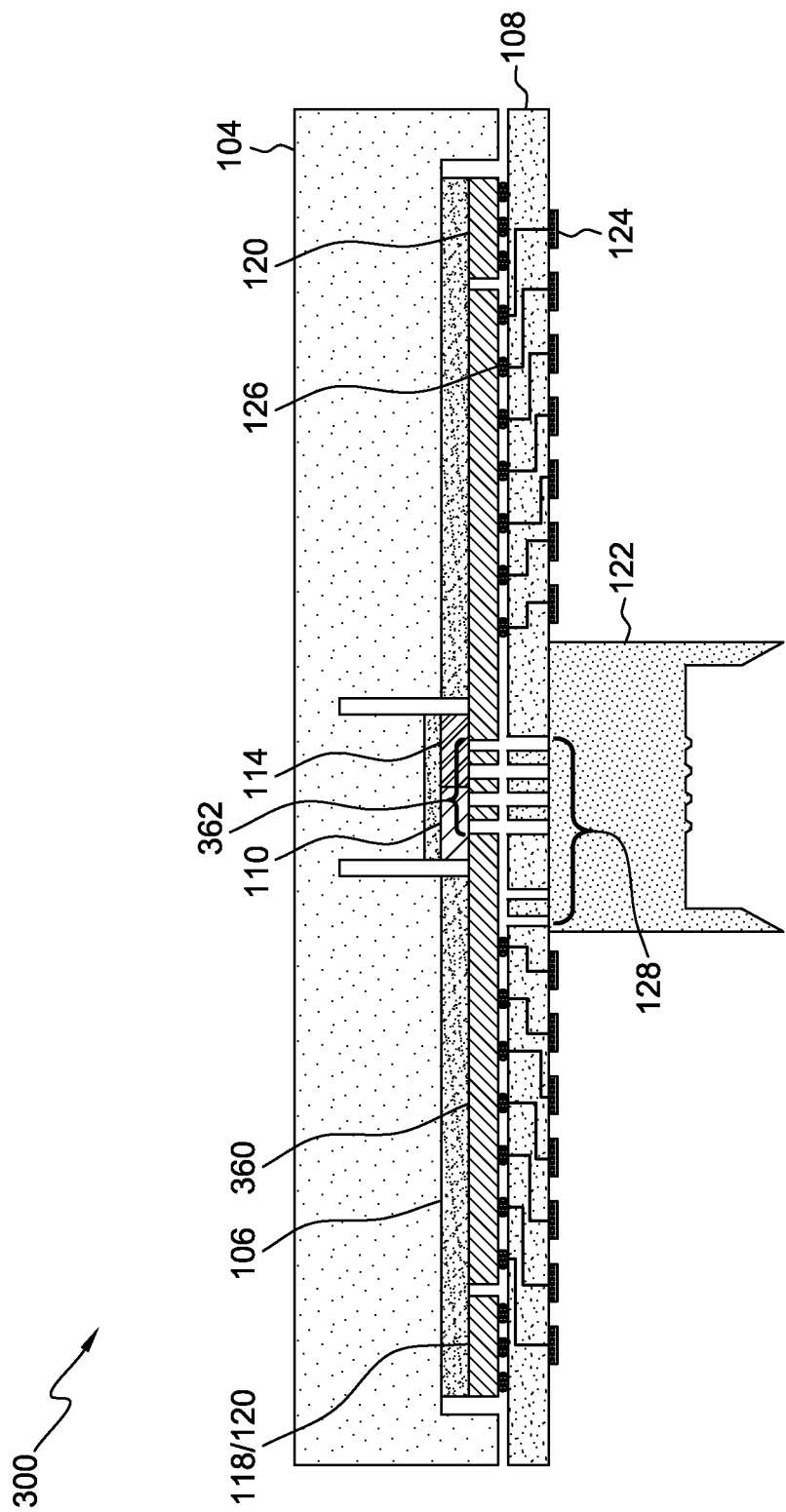
FIG. 3 is a cross sectional view of an alternate embodiment of the integrated parallel optical transceiver, in accordance with an embodiment of the present invention.

FIG. 3 is a cross sectional view of an alternate embodiment of integrated parallel optical transceiver 300, in accordance with an embodiment of the present invention. In the embodiment depicted in FIG. 3, integrated parallel optical transceiver 300 incorporates combined transmitter and receiver chip 360 in place of laser driver chip 112 and receiver amplifier chip 116 of the embodiment of FIG. 1C. Combined transmitter and receiver chip 360 performs the functions of both laser driver chip 112 and receiver amplifier chip 116. Combined transmitter and receiver chip 360 may be constructed using CMOS or SiGe technology. Combined transmitter and receiver chip 360 includes optical vias 362, i.e., openings, in the silicon that allow light beams to pass through. VCSEL array chip 110 and photodetector array chip 114 are coupled with combined transmitter and receiver chip 360 in alignment with optical vias 362 in order to enable interaction of VCSEL array chip 110 and photodetector array chip 114 with optical coupling element 122, through carrier 108, via openings 128. For example, VCSEL array chip 110 and photodetector array chip 114 may be coupled to combined transmitter and receiver chip 360 via flip chip assembly on combined transmitter and receiver chip 360. In the depicted embodiment, heat spreader/stiffener 104 is in contact with the active components, as described in previous embodiments, however the heat removal from VCSEL array chip 110 and photodetector array chip 114 may be less efficient, since VCSEL array chip 110 and photodetector array chip 114 are mounted on a surface of combined transmitter and receiver chip 360, which may be hotter than carrier 108, on which VCSEL array chip 110 and photodetector array chip 114 are coupled via flip chip assembly, as described with respect to FIG. 1B. Electrically, the arrangement of VCSEL array chip 110 and photodetector array chip 114 mounted on combined transmitter and receiver chip 360 may improve signal integrity at high frequencies or high bitrates because the signal traces between VCSEL array chip 110 and photodetector array chip 114 and combined transmitter and receiver chip 360 can be shorter than in the embodiment depicted in FIG. 1C.

Figure 4:
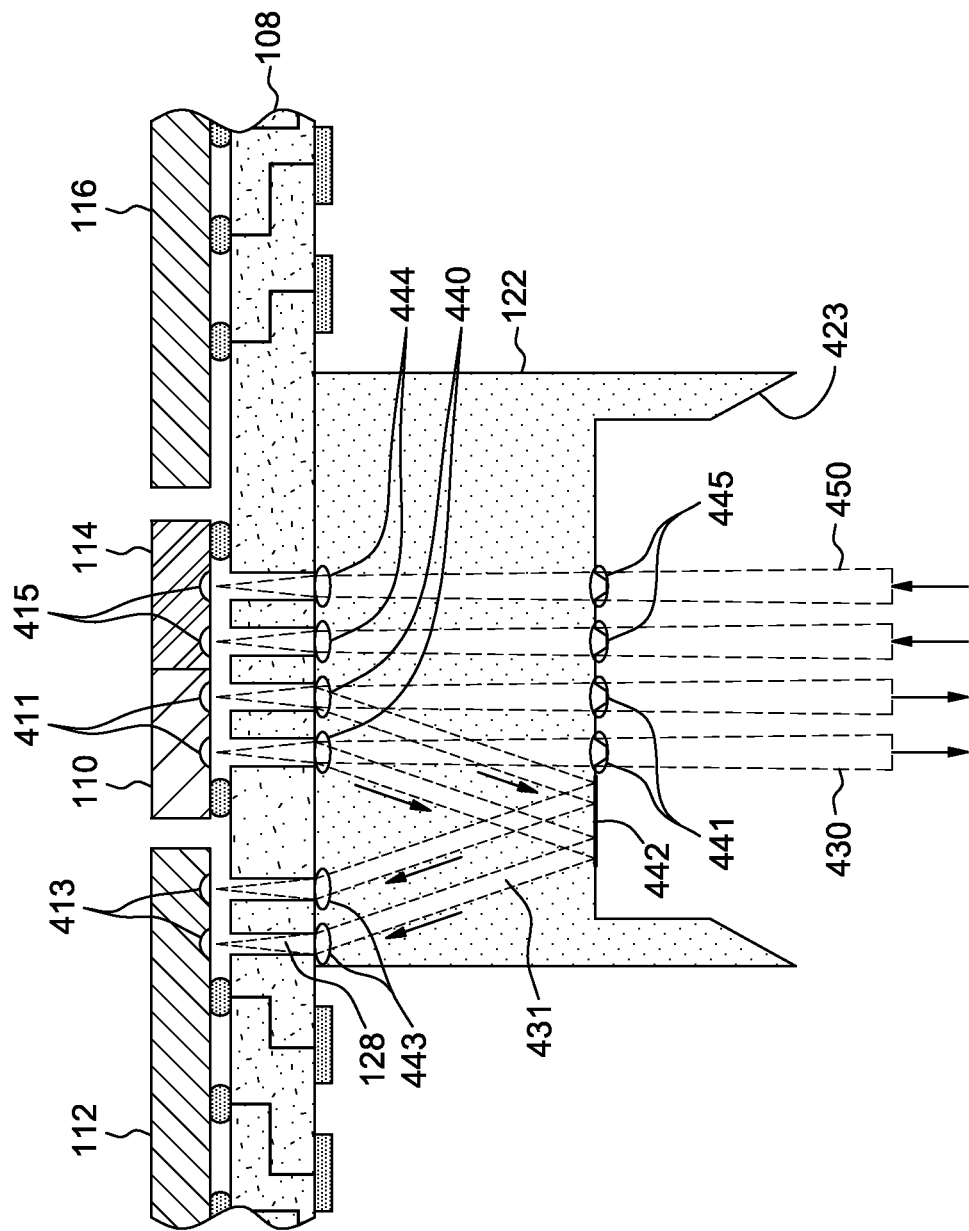
FIG. 4 is a cross sectional view of an optical coupling element, in accordance with an embodiment of the present invention.

FIG. 4 is a cross sectional view of optical coupling element 122, in accordance with an embodiment of the present invention. Optical coupling element 122, within integrated parallel optical transceiver 100, includes sampling lenses 440, collimating lenses 441, feedback mirror 442, monitor focusing lenses 443, final receiver focusing lenses 444, and focusing lenses 445. For clarity, posts 136 are not shown. For the transmitter portion of integrated parallel optical transceiver 100, VCSELs 411 in VCSEL array chip 110 emit transmitted beams 430. Sampling lenses 440 allow the majority of each output beam's optical power to propagate forward to one of collimating lenses 441, which collimate each optical beam, i.e., change from a diverging beam to a straight beam, as the optical beam exits the transceiver. Also, sampling lenses 440 split transmitted beams 430, extracting a small portion of optical power into an array of feedback sample beams 431. Feedback mirror 442 reflects feedback sample beams 431 to monitor focusing lenses 443, which focus feedback sample beams 431 into monitor photodiodes 413 of laser driver chip 112, through openings 128. The combination of lenses, mirrors, and monitor photodiodes enables monitoring of VCSEL output power, which, in turn, enables laser driver chip 112 to precisely control the output power of VCSELs 411 by adjusting the laser bias current. For the receiver portion of integrated parallel optical transceiver 100, focusing lenses 445 and final receiver focusing lenses 444 focus incoming beams 450, i.e., change from a straight beam to a converging beam, into photodiodes 415 in photodetector array chip 114.

The housing of optical coupling element 122 may enable optical coupling element 122 to operate as an alignment block with lead-in surfaces 423 on the interior edges of a frame that guides an optical connector ferrule (not shown), or other corresponding coupling element, to alignment with collimating lenses 441 and focusing lenses 445. In one embodiment, the housing of optical coupling element 122 is fabricated of one of a plurality of molded plastics that are transparent at the wavelength of a transmitter laser. For example, the housing of optical coupling element 122 may be fabricated of Ultem® material. The lenses may be fabricated by various means, including molding of the material of optical coupling element 122, and including attachment of discrete optical lens material. Feedback mirror 442 may also be fabricated by various means, including coating a portion of optical coupling element 122 with a reflective material, or molding a surface into a portion of optical coupling element 122 which reflects feedback sample beams 431 using total internal reflection.

Figure 5:
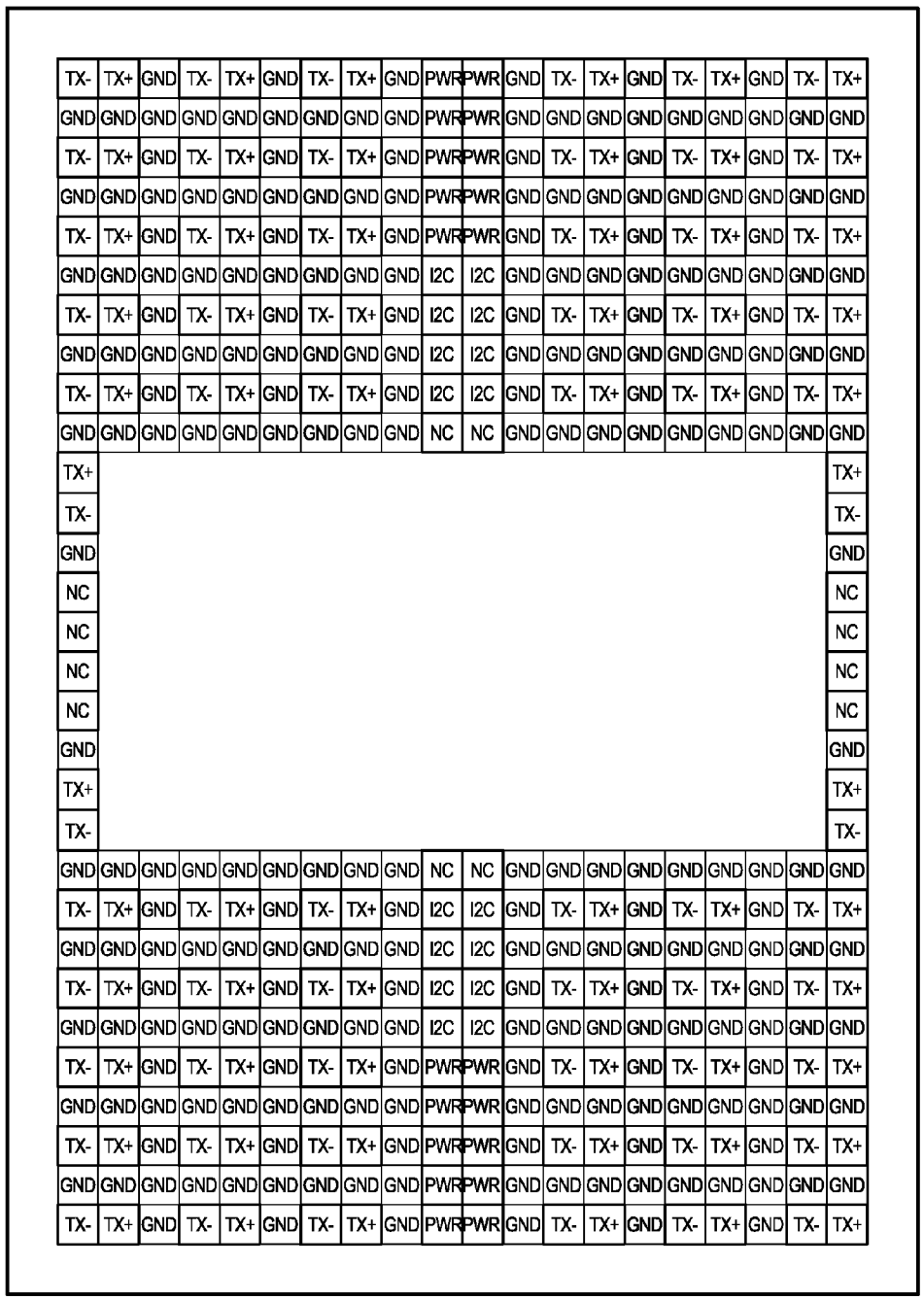
FIG. 5 depicts an example pinout diagram for a carrier in the integrated parallel optical transceiver, in accordance with an embodiment of the present invention.

FIG. 5 depicts example pinout diagram 500 for carrier 108 in integrated parallel optical transceiver 100, as depicted in FIG. 1C, in accordance with an embodiment of the present invention. In an embodiment, pinout diagram 500 is a wiring, or routing, plan for carrier 108 that supports 32 transmitter optical channels and 32 receiver optical channels. Each labelled box within pinout diagram 500 represents each of electrical contact pads 124. The labels within each labelled box in pinout diagram 500 represent a particular electrical connection, for example, GND indicates ground, TX+/TX− indicate the positive and negative signals of a transmitting differential pair, RX+/RX− indicate the positive and negative signals of a receiving differential pair, NC indicates not connected, PWR indicates power, and I2C indicates pins to support a management/service bus. The center of pinout diagram 500 is blank to prevent, or "keep out," internal wiring in the center of carrier 108 where optical coupling element 122 connects to carrier 108 and where openings 128 are placed. In an embodiment, the dimensions of carrier 108 are 10 mm×14 mm, enabling an LGA pad pitch for electrical contact pads 124 of 0.4 mm. In another embodiment, fewer, or more, channels may be designed into carrier 108 using the same concepts as the depicted embodiment. In a further embodiment, integrated parallel optical transceiver 100 may include unmatched quantities of transmitting and receiving channels, i.e., the number of transmitting channels does not equal the number of receiving channels.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An optical transceiver comprising:
   a carrier having two opposing surfaces and one or more openings extending from a first surface of the two opposing surfaces to a second surface of the two opposing surfaces;
   a laser driver chip coupled to the first surface;
   a vertical cavity surface emitting laser (VCSEL) array chip coupled to the first surface;
   a photodetector array chip coupled to the first surface;
   a receiver amplifier chip coupled to the first surface; and
   an optical coupling element coupled to the second surface, wherein the optical coupling element includes a housing with one or more lead-in surfaces that guide an optical connector ferrule to alignment with the optical coupling element, and wherein the optical coupling element includes at least one of: a plurality of sampling lenses, a plurality of collimating lenses, at least one feedback mirror, a plurality of monitor focusing lenses, a plurality of final receiver focusing lenses, or a plurality of focusing lenses;
   wherein the VCSEL array chip and the photodetector array chip are disposed such that optical signals can pass through the one or more openings in the carrier.

2. The optical transceiver of claim 1, further comprising a heat spreader/stiffener coupled via one or more intermediary components to at least a portion of the laser driver chip, the VCSEL array chip, the photodetector array chip, and the receiver amplifier chip.

3. The optical transceiver of claim 2, wherein the heat spreader/stiffener is coupled to at least a portion of the laser driver chip, the VCSEL array chip, the photodetector array chip, and the receiver amplifier chip with at least one internal thermal interface material.

4. The optical transceiver of claim 2, wherein the heat spreader/stiffener is coupled to at least one external thermal interface material.

5. The optical transceiver of claim 1, further comprising a plurality of electrical contact pads coupled to the second surface of the carrier, and wherein one or more of the plurality of electrical contact pads surround the optical coupling element.

6. The optical transceiver of claim 1, wherein the laser driver chip, the VCSEL array chip, the photodetector array chip, and the receiver amplifier chip are coupled to the carrier via flip chip technology.

7. The optical transceiver of claim 1, wherein the carrier is one of an organic laminate or a ceramic carrier.

8. The optical transceiver of claim 1, wherein the openings in the carrier are of a cylindrical shape.

9. The optical transceiver of claim 1, wherein the carrier includes one or more openings to accommodate mating posts.

10. The optical transceiver of claim 1, wherein the optical coupling element is configured to interface with a plurality of optical fibers.

11. The optical transceiver of claim 1, wherein the optical coupling element is configured to receive a corresponding coupling element containing a plurality of optical fibers.

12. The optical transceiver of claim 1, wherein at least one surface of the optical coupling element is transparent at a wavelength of a transmitter laser.

13. The optical transceiver of claim 1, wherein the optical coupling element includes one or more posts for mating to the one or more openings in the carrier.

14. The optical transceiver of claim 1, wherein optical signals pass through the one or more openings in the carrier.

15. The optical transceiver of claim 1, wherein electrical signals pass through one or more signal traces in the carrier.

* * * * *